United States Patent
Yatsuo et al.

(10) Patent No.: US 6,353,236 B1
(45) Date of Patent: Mar. 5, 2002

(54) SEMICONDUCTOR SURGE ABSORBER, ELECTRICAL-ELECTRONIC APPARATUS, AND POWER MODULE USING THE SAME

(75) Inventors: Tsutomu Yatsuo; Takayuki Iwasaki; Hidekatsu Onose; Shin Kimura, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/396,733

(22) Filed: Sep. 15, 1999

(30) Foreign Application Priority Data

Sep. 17, 1998 (JP) .............................. 10-262698

(51) Int. Cl.[7] .......................................... H01L 31/0312
(52) U.S. Cl. .................... 257/77; 257/119; 257/173; 257/492; 257/603
(58) Field of Search .............................. 57/77, 119, 121, 57/177, 173, 492, 603

(56) References Cited

U.S. PATENT DOCUMENTS

| | | | |
|---|---|---|---|
| 3,885,243 A | | 5/1975 | Weisshaar et al. |
| 4,405,933 A | | 9/1983 | Avery |
| 5,051,785 A | * | 9/1991 | Beetz, Jr. et al. ............... 357/4 |
| 5,083,185 A | * | 1/1992 | Hayashi et al. |
| 5,164,874 A | | 11/1992 | Okano et al. |
| 5,304,844 A | * | 4/1994 | Horiuchi et al. ............ 257/676 |
| 5,334,853 A | * | 8/1994 | Yoder ............................. 257/10 |
| 5,449,925 A | | 9/1995 | Baliga et al. |
| 5,483,086 A | * | 1/1996 | Ohta ............................. 257/111 |
| 5,661,644 A | | 8/1997 | Bergman et al. |
| 5,705,853 A | * | 1/1998 | Faller et al. ................. 257/719 |
| 5,815,359 A | * | 9/1998 | Maytum et al. ............ 361/111 |
| 5,831,287 A | * | 11/1998 | Bakowski et al. ............ 257/77 |
| 5,914,499 A | | 6/1999 | Hermansson et al. |
| 6,087,682 A | * | 7/2000 | Ando .......................... 257/178 |

FOREIGN PATENT DOCUMENTS

| | | |
|---|---|---|
| EP | 0 492 032 | 7/1992 |
| EP | 0744 834 | 11/1996 |
| JP | 363073673 | * 4/1988 |

* cited by examiner

Primary Examiner—Nathan Flynn
Assistant Examiner—Remmon R. Fordé
(74) Attorney, Agent, or Firm—Mattingly, Stanger & Malur, P.C.

(57) ABSTRACT

A wide bandgap semiconductor single crystal is applied as a semiconductor substrate material of a semiconductor surge absorber, and a surge absorption operation starting voltage is set by a punchthrough of a pn junction, to obtain a semiconductor surge absorber with a repetitive operation and a high surge endurance.

21 Claims, 8 Drawing Sheets

SEMICONDUCTOR SURGE ABSORBER, ELECTRICAL-ELECTRONIC APPARATUS, AND POWER MODULE USING THE SAME

BACKGROUND OF THE INVENTION

The present invention relates to a semiconductor surge absorber for protecting an electrical apparatus and an electronic circuit, etc.: from overvoltage.

In an electronic apparatus using the electric and electronic circuits, a circuit or a protection element with overvoltage protection function is used to prevent damage of the electronic circuit and an electronic component by an instantaneous surge overvoltage. As overvoltage surges, there are an external lightning surge arising by lightning and abnormality of an electric power distribution system coming from an electric distribution line, and an internal lightning surge arising by on and off spark abnormality of switches, etc. inside the apparatus. A protection circuit and a protection element responding to each lightning surge are used in order to ensure a safety of the electronic apparatus.

The elements which protect the apparatus by the absorption of the overvoltage surge are named varistor or arrester collectively. For the external lightning surge, a grain boundary barrier-type varistor which consists of a ceramic made from sintered crystallites that have a main component of ZnO or SiC(silicon carbide) is widely used. The grain boundary barrier-type varistor becomes a cheap and high-performance arrester, because the varistor is using nonlinear characteristics of a ceramic resistor in which resistance value sharply decreases beyond a certain electric field intensity and it is comparatively simple to be manufactured. Therefore, this varistors is applied in great numbers not only as arresters of an electrical apparatus field but also as protection vessels of an electronic apparatus field such as a personal computer and a communicator. However, the conventional varistor has problems on its performance. One of the problems is a constant voltage characteristic which is related to an operation resistance. Since a large inside voltage drop is generated in a surge current energization by the resistance component of the ceramic, a large voltage difference occurs between an operation starting voltage (build-up voltage) and an maximum operation voltage (supreme voltage, namely maximum voltage which an element can protect). The voltage difference increases as a large-capacity element, and it reaches about ½ of operation starting voltage for a high power element. Therefore, it is necessary to set a voltage endurance design of an electrical apparatus at a considerably large voltage in comparison with an actual operating voltage. Consequently, not only enlargement and high price but also efficiency lowering by the increase in the power loss of the apparatus is a large problem against resource conservation and energy saving. Another problem concerns a repeated operation. Repetition constant voltage characteristic of the varistor of the sintering resistor is not secured because of the temperature characteristic of the resistor. Therefore, the application of the varistor is limited to the application which protects the apparatus from the instant surge voltage, which is one-shot like the arrester and the protection vessel. The varistor hardly can be applied to the case in which it is protected from the overvoltage which generates the application, for example the semiconductor element in the inverter apparatus, of which the overvoltage is repeatedly applied in the inside. For overvoltage countermeasure in such apparatus, a snubber circuit with resistance and snubber circuit composed of a resistor and a capacitor, etc. or a circuit having a clamp function of the voltage is connected with the semiconductor element, and the voltage endurance of the semiconductor element is set high over the double of source voltage. However, there is a problem of causing enlargement, high price and increase in power loss of the apparatus.

As a surge absorber which overcomes the problem in the varistor of the sintering resistor, the element called a junction type varistor using the breakdown phenomenon of a pn junction of Si has been used practically. For example, this element has been described, Inst. of Electronics, Inf. and Commun. Engineering edition, "the electronic information communication handbook" ninth edition, page 774 semiconductor device, second department diode. The element positively utilizes fixed breakdown voltage for reverse current of wide range, in which two kinds of breakdown phenomenon in the Si pn junction occurs, namely avalanche breakdown and Zener breakdown. The element is designed so that the function and structure is suitable for the breakdown characteristic.

FIG. 2a shows a cross section and FIG. 2b shows a voltage-current characteristic of an epitaxial type voltage regulator diode using the avalanche breakdown phenomenon. A p type poly crystal Si is selectively grown on n type single crystal silicon. By a concentration gradient near pn junction that is formed with heat treatment diffusing a p type impurity in Si after the epitaxial layer formation and an impurity in the n type single crystal silicon as a substrate, the delicate control of the breakdown voltage is possible. The p type impurity layer can also be controlled by an ion-implantation and a afterwards diffusion. The breakdown region causes the avalanche breakdown in the almost fixed voltage like FIG. 2b and the reverse current remarkably increases, when the reverse-directional voltage in the diode is applied. The quality of the performance as a surge absorber is shown at an inclination ($\Delta VZ/\Delta IZ$)(=operation resistance Zz) of voltage (VZ) and current (IZ) of the breakdown region. The constant voltage characteristic becomes better, as this inclination becomes smaller.

A current-voltage characteristic is approximated that of the following equation.

$$IZ = (VZ/C)^\alpha$$

C is a constant and $\alpha$ is defined herein a voltage nonlinearity index, in which $\alpha=1$ is usual resistance. An excellent varistor is provided as $\alpha$ is bigger. The varistor of the Si surge absorber has $\alpha=100\sim500$, while the above mentioned sintering resistor has $\alpha\sim50$. In addition, the Si surge absorber is widely used as a protection element of electronic apparatus, because the surge absorber endures the repetition operation of only small power and only low temperature. However, there is a problem that a surge endurance of the conventional Si surge absorber is remarkably smaller than that of the varistor of sintered resistor. The application of the Si surge absorber is comparatively limited to the surge absorber in the electronic apparatus of small capacity, since the Si surge absorber has an operating voltage of a few V~several hundred V and a peak pulse current of about 100 A and an operating voltage of a few V~several hundred V. The surge absorber needs to absorb a large energy, which is instantaneous. The Si surge absorber has the low operation supreme temperature of the pn junction of usual 150~200° C., and a heat capacity of Si is comparatively small. Therefore, the absorbed energy allowed in the Si surge absorber is remarkably more limited than the ceramic varistor.

As described above, within the conventional technology, the element with excellent surge absorber function, that the flat rate of the voltage is good since the operation resistance is low, that the repetitive operation is possible, and that it stands the use of wide voltage—current region since the surge endurance is large, does not exist.

SUMMARY OF THE INVENTION

This invention, in which the above problems are considered, has the following objects.

An object of present invention is to offer a semiconductor surge absorber which has a large surge endurance, and in which a repeated operation is possible.

An another object of present invention is to offer an electric apparatus, an electronic apparatus, and a power module, which have a high performance, using a semiconductor surge absorber.

A semiconductor surge absorber according to an invention has a semiconductor substrate having a semiconductor single crystal with bandgap energy not less than 2.0 eV. The semiconductor substrate has a first semiconductor layer of a first conductivity type, a second semiconductor layer which forms a pn junction with the first semiconductor layer, and a third semiconductor layer which forms another pn junction with the first semiconductor layer. The second semiconductor layer is electrically connected to an electrode, and the third semiconductor layer is electrically connected to another electrode. In addition, a punchthrough voltage is lower than an avalanche voltage in each of the pn junction and the another pn junction. The first conductivity type and the second conductivity type are respectively p type or n type, and opposite conductivity types with respect to each other. Therefore, the semiconductor surge absorber according to the invention has bi-directionality, because the fundamental junction geometry of the semiconductor substrate becomes pnp or npn.

Since the semiconductor material is the single crystal in the semiconductor surge absorber according to the invention, an excellent characteristic of a large voltage nonlinearity index α in a conventional surge absorber using the single crystal silicon is retained. In addition, since the semiconductor material is wide bandgap semiconductor with bandgap energy not less than 2.0 eV, the operation supreme temperature and the crystal melting temperature are high, and the thermal conductivity is high. Therefore, the semiconductor surge absorber has the large surge endurance and the repeated operation.

In addition, a surge absorption operation starting voltage in which a current suddenly flows out is decided by the punchthrough voltage, because the punchthrough voltage is lower than the avalanche voltage in each pn junction of the semiconductor surge absorber. The punchthrough voltage is set by impurity total amount of a semiconductor layer which forms a pn junction. Therefore, even if setting an accurate avalanche voltage of a wide bandgap semiconductor is difficult for a property of difficulty of impurity diffusion in the semiconductor, the operation starting voltage is set with high-precision. It is desirable that impurity concentration of the second and third semiconductor layers is larger than the first semiconductor layer and that the punchthrough voltage is set by a punchthrough of a depletion layer in the second and third semiconductor layer. By this, the surge absorption operation starting voltage is high-precisely set by impurity total amount introduced into the semiconductor substrate, when the second and third semiconductor layers are formed.

In the case of applying an avalanche breakdown instead of a punchthrough breakdown, the wide bandgap single crystal semiconductor also carries a large surge endurance and a repeated operation for a semiconductor surge absorber. Additionally, an operation starting voltage of a semiconductor surge absorber having a semiconductor substrate having a semiconductor single crystal with bandgap energy less than 2.0 eV such as Si is also set with high-precision with applying the punchthrough breakdown.

A semiconductor surge absorber made from single crystal semiconductor material with the bandgap energy not less than 2.0 eV is connected to the electrical and electronic apparatus according to the invention. A large margin for a source voltage or a continuous operating duty voltage become unnecessary in setting of a blocking voltage of the electrical and electronic apparatus, since the connected surge absorber has a high surge endurance and it operates repeatedly by the wide bandgap single crystal semiconductor material. Therefore, the electrical and electronic apparatus are miniaturized, and the power loss is reduced. Especially, an effect of the invention is remarkable, when the high voltage is handled. New electrical and electronic apparatus with a source voltage or a continuous operating duty voltage not less than 220 V and a blocking voltage from 100–150% of a peak value of the source voltage or the continuous operating duty voltage are realized. An electrical apparatus such as a power converter and a various power source and an electronic apparatus such as a communication device and a terminal apparatus and a computer are included on the electrical and electronic apparatus according to the invention.

A power module according to the invention has a metal plate, a circuit board bonded on the metal plate, and a semiconductor switching element and a semiconductor surge absorber connected to each other in parallel by mounting in the metal plate and the circuit board. When a voltage applied to the semiconductor switching element in the power module rises, the applied voltage is clamped at punchthrough voltage of an operation starting voltage in the semiconductor surge absorber. Therefore, a large margin for a source voltage or a continuous operating duty voltage become unnecessary in setting of a blocking voltage of the semiconductor switching device. Concretely, a blocking voltage of the semiconductor switching element is set to 100–150% of the peak value of source voltage. Therefore, the power loss of the power module is reduced. In electrical and electronic apparatus according to the invention, a similar action and effect occur by parallel connecting a semiconductor surge absorber including the semiconductor surge absorber according to the invention, which is made from a wide bandgap semiconductor single crystal material, when the apparatus have the semiconductor switching element.

DETAIL DESCRIPTION OF THE PREFERRED EMBODIMENTS

The invention is explained in detail, showing embodiments.

Figure 1:
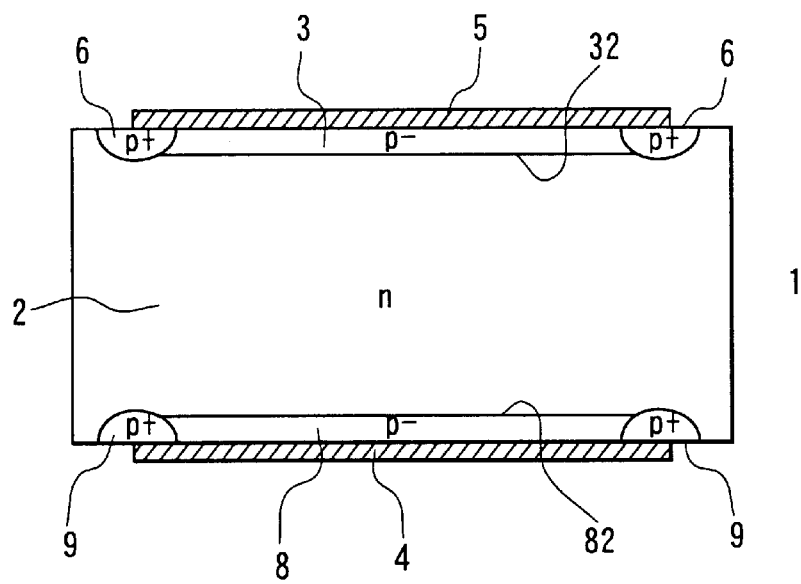
FIG. 1 shows a sectional view of a semiconductor surge absorber of a first embodiment according to the invention.

FIG. 1 is a first embodiment of a semiconductor surge absorber according to the invention, and it shows a sectional view of a high voltage junction type varistor having improved tolerance for bidirectional surge currents. A semiconductor substrate 1 of a SiC single crystal flat plate, with main surfaces in top and bottom, has a comparatively deep n type layer having an impurity concentration of $5 \sim 8 \times 10^{15}$ cm$^{-3}$ and about 200 μm thickness, p– type layers 3 and 8 having a depth of about 0.5 μm from the respective main surface of semiconductor substrate 1, an impurity total amount of about $7 \times 10^{12}$ cm$^{-2}$ and an average impurity concentration of about $8 \times 10^{16}$ cm$^{-3}$; pn junctions 32 and 82 are formed between these semiconductor layers. In the main surface where the p– type layer 8 exposes, an electrode 4 such as an Al metal contacting in ohmic to the main surface is formed. In the other main surface where the p– type layer 3 exposes, an electrode 5 such as an Al metal contacting in ohmic to the other main surface is formed. In a peripheral edge portion of the p– type layers 3, 8, both electrodes 4,5 terminate. In the n type layer 2 from the respective main surfaces, p+ type layers 6,9, which have a deeper junction depth and a higher impurity concentration than the p– type layer 3,8, having an average impurity concentration of about $2 \times 10^{17}$ cm$^{-3}$ and about 0.7 μm depth from the each main surface of the semiconductor substrate 1 are formed. The electrodes 5,4 contact in ohmic low resistance to the p+ type layers 6,9, respectively. It is possible that the electrodes are electrically connected to the semiconductor layers through another conductor or another semiconductor layer between the electrodes and the semiconductor layers.

An operation supreme temperature of the junction of a single crystal SiC is high such as about 1000° C., since the bandgap energy Eg is large such as 3.2 eV, being about 3 times of Si Eg=1.1 eV. Additionally, the crystal melting temperature is high, such as 2300° C., and the thermal conductivity is also high, such as about 3 times that of Si. Consequently, SiC is a thermally resistant semiconductor material. Therefore, the junction type varistor of the embodiment has considerably large surge endurance larger than a conventional surge absorber which is made from Si semiconductor material, and the varistor is able to repeat a surge absorption operation. The action of each part in the embodiment is explained in the following.

The reverse voltage is blocked in the pn junction 32, when a voltage is applied of a direction where the electrode 4 becomes a positive potential relative to the other electrode 5. The depletion layer blocks the voltage, spreading in the n type layers 2 and in the p– type layer 3 from the pn junction 32. The extent of the depletion layer in each layer expands with an increase in the applied reverse voltage. The relationship of XnNn=XpNp is retained, if a depletion layer width, an average impurity concentration of the n type layer 2 and the p– type layer 3 are respectively Xn,Nn and Xp,Np. In the embodiment, Xp<<Xn, because of Np>>Nn. Xp spreads to the whole of the p– type layer 3 at a voltage lower than a voltage in which a field intensity of the pn junction reaches a dielectric breakdown electric field (about $2 \times 10^6$ V/cm in SiC) since a thickness of the p– type layer 3 is very small. Then, a punchthrough phenomenon happens at a voltage as the depletion layer reaches the other main surface of the semiconductor substrate 1, and the pn junction 32 breaks down. Therefore, a punchthrough breakdown occurs in the pn junction 32 before an avalanche breakdown occurs. The punchthrough voltage of the pn junction is lower than its avalanche voltage. In the embodiment, the avalanche voltage is about 1400 V, while the punchthrough voltage is about 1000 V. The punchthrough voltage is accurately controlled to the required voltage by a precise adjustment of an injection amount of a dopant by ion-implantation, since the punchthrough voltage is dependent on a total amount of an impurity of the p– type layer 3. An operation as mentioned above occurs at a breakdown voltage of the pn junction 82, when a reverse voltage is applied of a direction where the electrode 4 becomes a negative potential relative to the other electrode 5. In this case, a punchthrough voltage can be accurately controlled to a required voltage with adjusting precisely an impurity total amount of the p– type layer 8 by an injection amount of a dopant.

Figure 5:
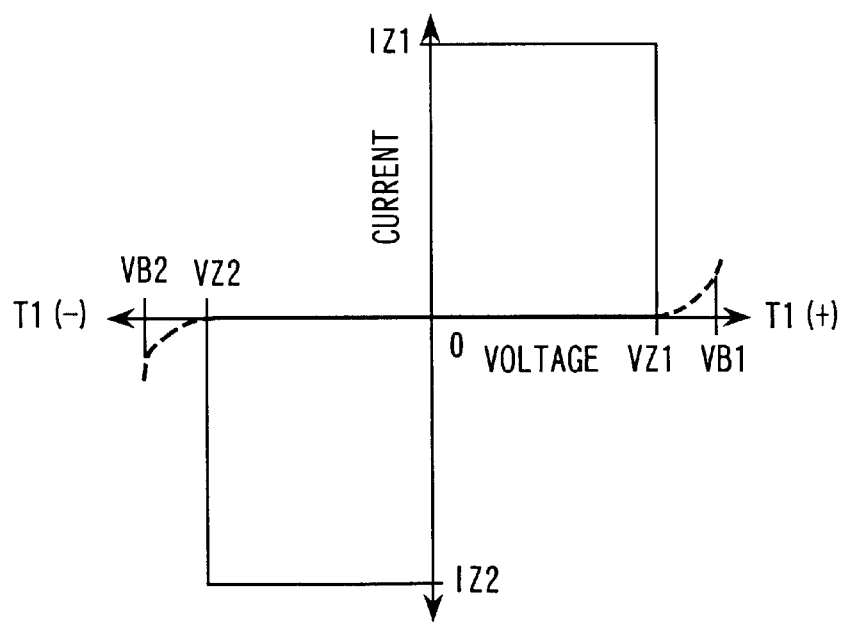
FIG. 5 shows a drawing for an explanation of an operation of the second embodiment.
Figure 2A:
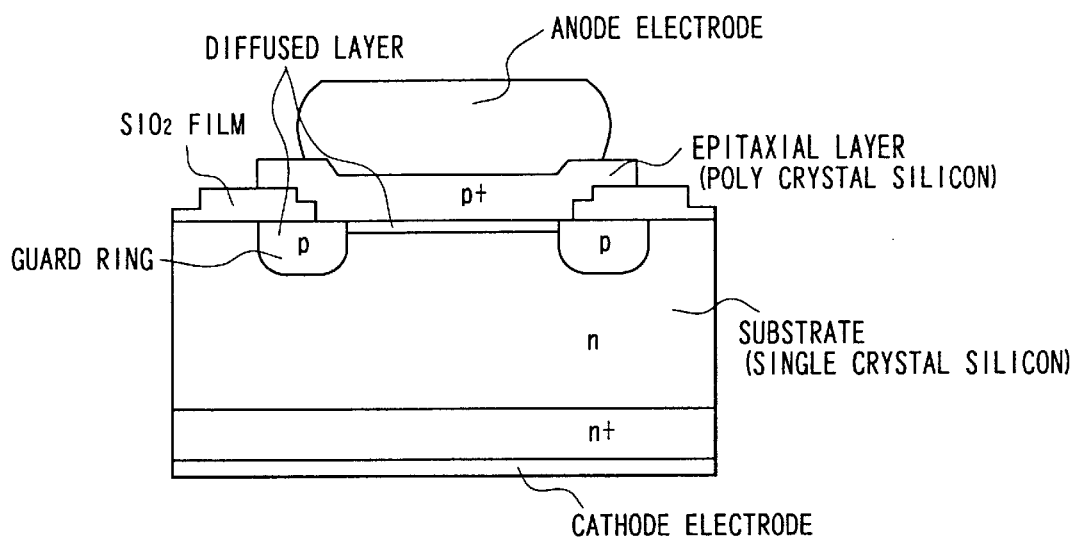
FIGS. 2(a) and 2(b) show a sectional view of a prior art and a drawing for an explanation of the operation.
Figure 2B:
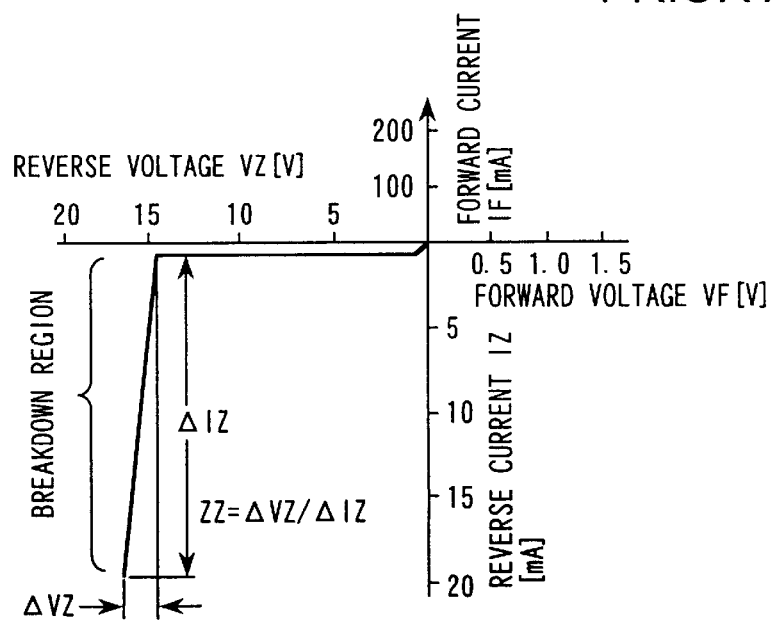

The above mentioned operation is explained as follows according to the voltage-current characteristic shown in FIG. 5. The reverse current rapidly flows, as the p– type layer 3 causes the punchthrough in a voltage VZ1, when the voltage is applied to a direction where the electrode (T1) 4 becomes positive between the electrode (T1) 4 and the other electrode (T2) 5. An usual pn junction with large amount of impurities of a p type layer breakdowns in the avalanche voltage VB1, and the element of the embodiment starts to breakdown at a fixed voltage VZ1 of VZ1<VB1. The reverse current suddenly flows, when a reversely-polarized is applied voltage of a direction in which the electrode (T1) 4 becomes negative, as the p– type layer 8 causes the punchthrough in a voltage VZ2. The usual pn junction with large amount of impurities in the p type layer breakdowns in an avalanche voltage VB2, and the element of the embodiment starts to breakdown in fixed voltage VZ2 of VZ2<VB2. The element of the embodiment is normally operated, even if a reverse current of about 1000 A is repeatedly applied in a period of 100 μs in the voltage of the bi-direction. The element of the embodiment has a voltage difference of about 40 V at IZ=1000 A, and it has surge absorption property of high performance of a voltage nonlinearity index α≈350. Consequently, in the embodiment, a junction type varistor with a surge absorptive function for an overvoltage of bi-direction is obtained.

The p+ type layers 6, 9 prevent lowering of the avalanche breakdown voltage by a locally concentrated electric field applied to edges of pn junction 32, 82 respectively. Therefore, the relation that the avalanche voltage is higher than the punchthrough voltage is surely obtained by the p+ type layer 6, 9 even if a pn junction of planar type is used. Though, in the embodiment, a guard ring structure usually used is shown, the other structures such as a field limiting ring (FLR), a field plate (FP) and a junction termination extension (JTE) can be used. While the electrode 4 and the other electrode 5 are in ohmic contacted to the p− type layer 3 and the p− type layer 8 in the main surface and the other main surface respectively in the embodiment, a Schottky contact can be used having a low barrier which breakdowns at a voltage enough lower than the punchthrough voltage. This is because there is not large effect for an operating voltage and an operation resistance. However, it can be easily understood to be more excellent with the above mentioned ohmic contact, even if it does not have a low resistance.

Figure 3A:
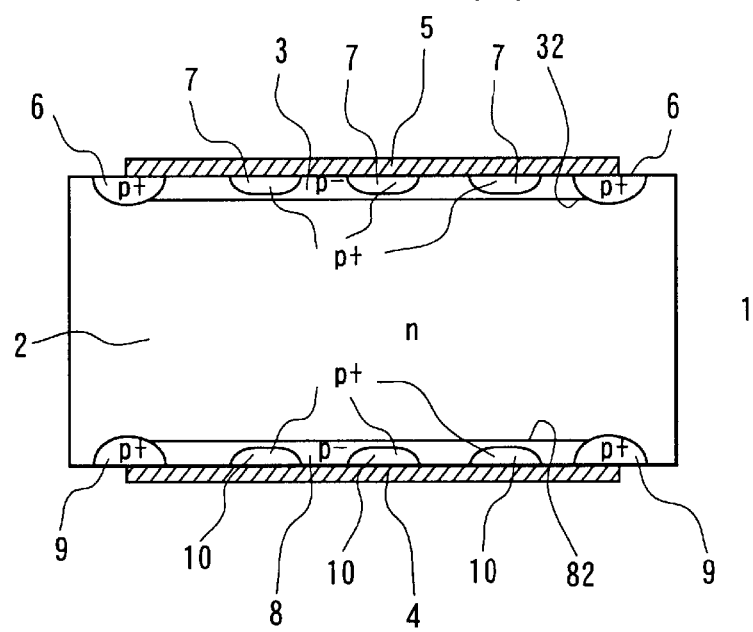
FIGS. 3(a) and 3(b) show a sectional view and a plan view of a semiconductor surge absorber of a second embodiment according to the invention.
Figure 3B:
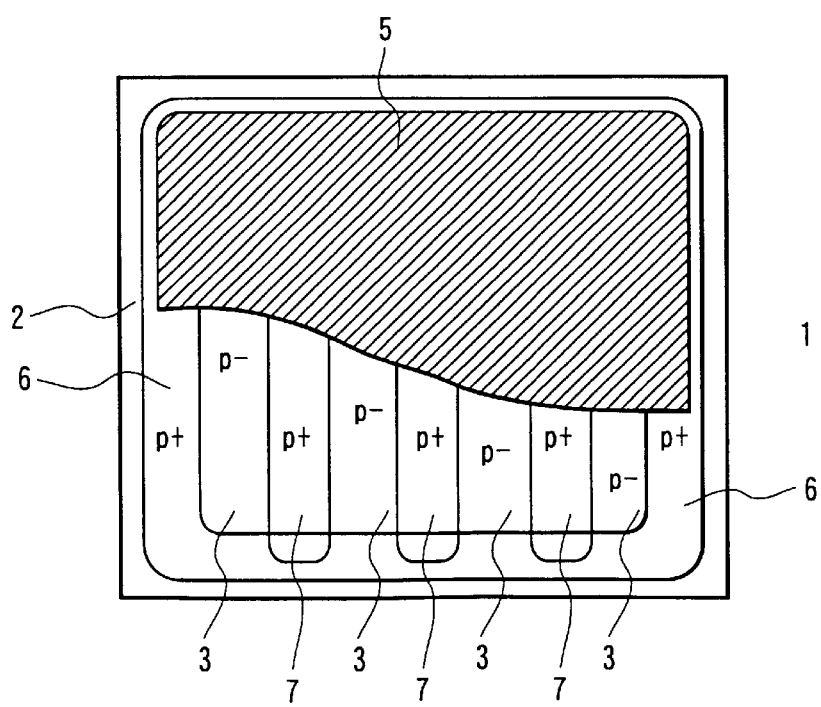

FIGS. 3(a) and 3(b) are of a second embodiment of a semiconductor surge absorber according to the invention. FIG. 3(a) shows a sectional view of the junction type varistor with improved uniformity of an operation. The same numerals are used in FIG. 1 and in FIG. 3 for the same parts of structures, conductivity types and actions. In FIG. 3(a), plural p+ type layers 10,7 having an impurity concentration higher than the p− type layers 8,3 are formed at positions not deeper than the pn junction 82,32 in these p− type layers 8,3 from the main surface and the other main surface of a main active region. The average impurity concentration of the p+ type layers 10 and 7, and the depth of the p+ type layers 10 and 7 from the main surface and the other main surface of the semiconductor substrate 1 are $1\times10^{17}$ cm$^{-3}$, and 0.2 $\mu$m, respectively. These layers are dispersed in a width and a mutual interval of each about 50 $\mu$m. As shown in FIG. 3(b), the p+ type layers 7,10 have stripe shapes, and both longitudinal ends of the stripe touch the p+ type layers 6,9. The p+ type layers 7,10 contact in ohmic with the electrode 5,4, respectively.

A main operation by the punchthrough phenomenon and an action of each part of this embodiment are similar to the first embodiment. In the region without the p+ type layer, the depletion layer in the p− type layer 3 extends by the above mentioned operation, when a reverse voltage is applied of the direction where the electrode 4 becomes a positive potential for the other electrode 5. At a voltage VZ in which the end of the depletion layer in the region without the p+ type layer reaches the main surface, the punchthrough breakdown occurs. In a region with the p+ type layer 7, the punchthrough does not occur at the voltage VZ, because the depletion layer extends into the p+ type layer 7 after the end of the depletion layer reaches the p+ type layer 7. As the result, the punchthrough operation is uniform over the wide area of the pn junction, because the region which causes the punchthrough is divided. In addition, the region which causes the punchthrough is divided by the action equal to the case of the p+ type layer 10, when a reverse voltage is applied to a direction where the electrode 4 becomes negative potential for the other electrode 5. In the embodiment, the uniform punchthrough operation over the wide area in the pn junction is secured for applying the voltages of the bi-direction polarity.

Bidirection surge absorptive function over the 5000 A maximum peak current is obtained, because the element of the large junction area of 10 cm$^2$ is realized by this structure. While the p+ type layers 7,10 in this embodiment separate from the pn junctions 32,82 since the depth of the p+ layers 7,10 are smaller than the depth of the p− type layers 3,8, a p+ layer with a depth not smaller than the depth of the p− type layers 7,10 has a same effect. However, in the p+ type layers deeper than the p− layers 3,8, the punchthrough voltage in the p− type layers 3,8 between the adjoin two p+ type layers changes, because a pinch off effect occurs by the overlap of the depletion layer by the adjoin two p+ type layers. Therefore, as shown in the embodiment, it is advantageous in order to ensure control and uniformity of the punchthrough voltage that the depth of the p+ type layers 7,10 is smaller than the depth of the p− type layers 3,8, respectively.

Figure 4A:
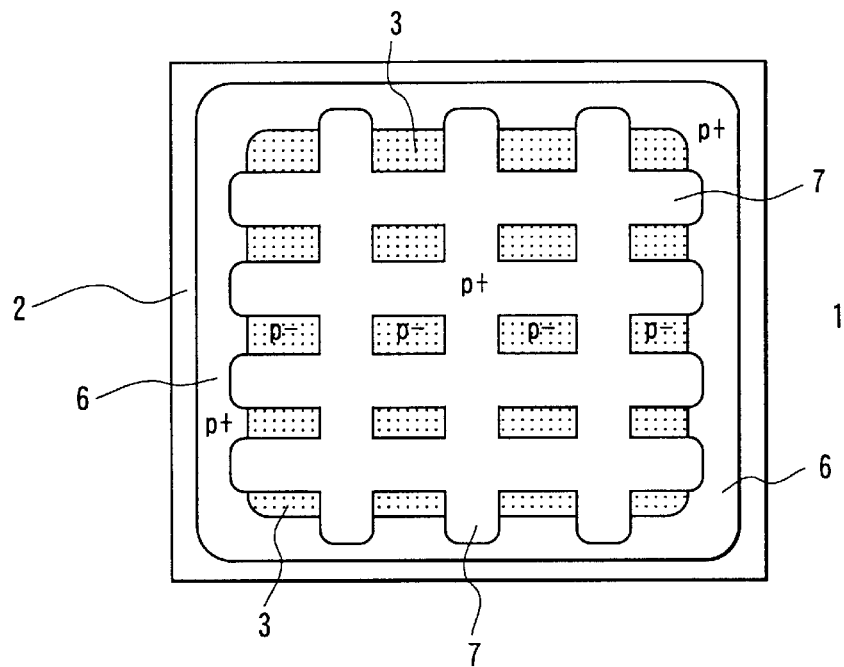
FIGS. 4(a) and 4(b) show other plan views of the second embodiment.
Figure 4B:
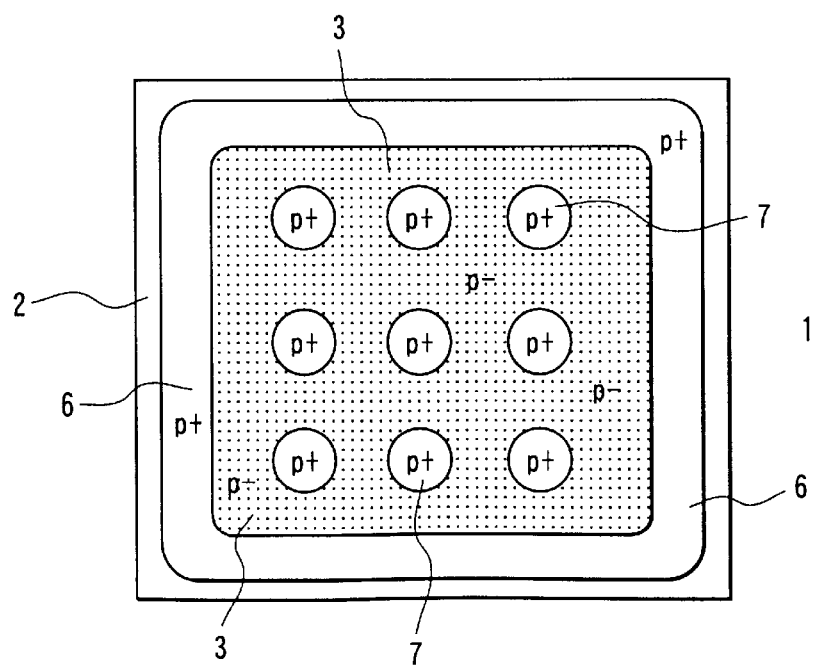

The plane pattern of the p+ type layers 7,10 is not limited to this embodiment example. FIGS. 4(a) and 4(b) show another plane averaged structure. FIG. 4(a) shows a mesh structure of the p+ type layer 7 like a lattice or a net, and FIG. 4(b) shows a dot or polka-dotted pattern. The p+ type layer 7 of these patterns has an effect like the effect mentioned above. It is possible to make a plane pattern of the p+ type layer 10 similar to the p+ type layer 7.

In the first and second embodiments described above, a material of the semiconductor substrate 1 is a SiC single crystal with energy (Eg) of 2.2~3.1 eV. However, the material is not limited only to SiC. Single crystal semiconductors having wide bandgaps such as GaN of Eg~3.4 eV and diamond of Eg~5.5 eV can be applied to the semiconductor substrate material. From viewpoints of a quality crystal, an application of Si device technologies in designing and manufacturing, etc., the SiC is desirable.

While the semiconductor substrate is a homogeneous n type single crystal in each embodiment, a (n−/n+/n−) substrate having thin n− type layers with impurities of comparatively low concentration are formed on both surfaces of a n+ type crystal of comparatively high impurity concentration by epitaxial growth. Since the impurity concentration of the (n−/n+/n−) substrate in a position of the pn junction is precisely controlled and the crystal defect of the substrate decreases, ease of controlling the punchthrough voltage and stability of the operating voltage are improved. A highly efficient surge absorber is obtained, because further reduction of the operation resistance is possible, if the (n−/n+/n−) substrate is used as the semiconductor substrate. While a conductivity type of the semiconductor substrate 1 is a n type in the above mentioned embodiments, a p type semiconductor substrate is applied, if conductivity types of each layer are all made to be contrary conductivity type.

While the p− type layers 3,4, the p+ type layers 6,9 and the p+ type layers 7,10 in the embodiments are made to be the respectively equal structure, to vary the impurity concentration and the junction depth and the pattern shape is possible. Therefore, characteristics of the bi-direction is controlled respectively and independently.

Figure 6:
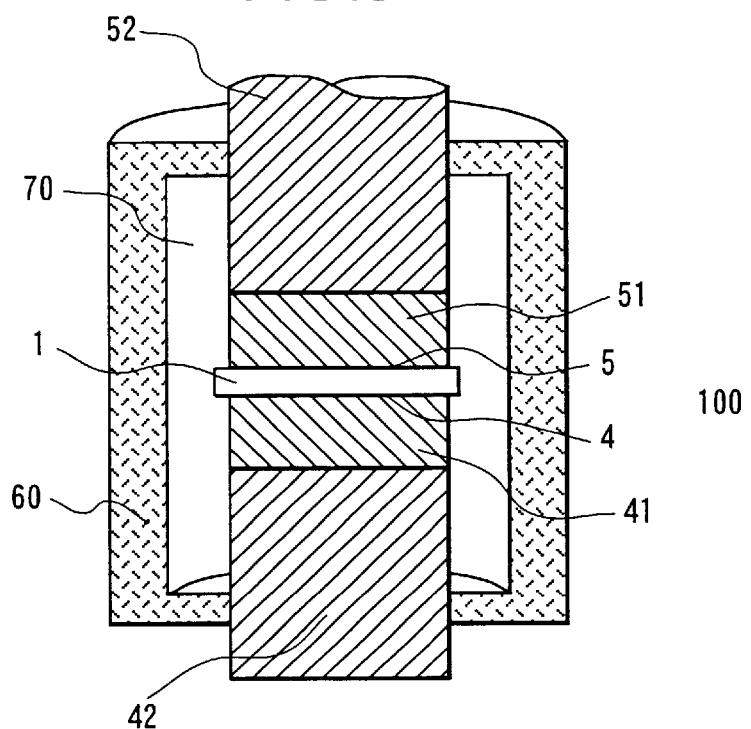
FIG. 6 shows a sectional view of the semiconductor surge absorber according to the invention installed in a package.

FIG. 6 shows the semiconductor surge absorber installed in a package. Semiconductor pellet of 1 is the junction type varistor according to the embodiments with pn junction formed in SiC single crystal. Metal electrodes 41 and 51, between which a semiconductor pellet 1 is held, are electrically connected to the electrode 4 and the other electrode 5 of the semiconductor pellet 1. These metal electrodes are materials with thermal expansion coefficients which are near for a semiconductor substrate, like a Mo metal plate. Outside terminal electrodes 42 and 52 like the Cu metal are electrically connected with the Mo metal plates, while semiconductor pellet and Mo metal plate are held. A package outside frame 60 of a ceramic or an insulating resin 60 seals a semiconductor functional part. $N_2$, $SF_6$ insulation gas, insulation oil or insulating resin 70 is used for electrical insulation of the package inside and for protection of the surface of the semiconductor pellet. The surge absorber is used by connecting in an electric circuit.

Figure 7:
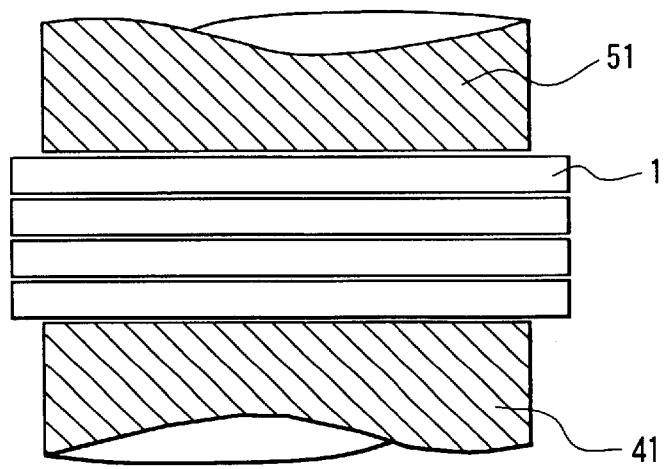
FIG. 7 shows a sectional view of a pellet of the semiconductor surge absorber according to the invention installed in a package.

FIG. 7 shows a semiconductor pellet applied to the mounted device of which operation starting voltage is high. Semiconductor pellet 1 is the junction type varistor with the pn junction formed in the SiC single crystal. In this embodiment, four semiconductor pellets are stacked in series. Each pellet is electrically connected in series by adhesion or contact. Numerals 41 and 51 show the metal electrodes. The semiconductor surge absorber has the operation starting voltage 4000 V, if the breakdown voltage per one of the semiconductor pellets is 1000 V. Increase and decrease of the number of series-connected semiconductor pellets adjust the operation starting voltage. Since an insulation design of an edge of the pn junction of each pellet is easy in comparison with a case of use of one high voltage pellet, and because each pellet shares the high operating voltage, the high reliability is ensured and the cost of the elements is effectively reduced.

Figure 8:
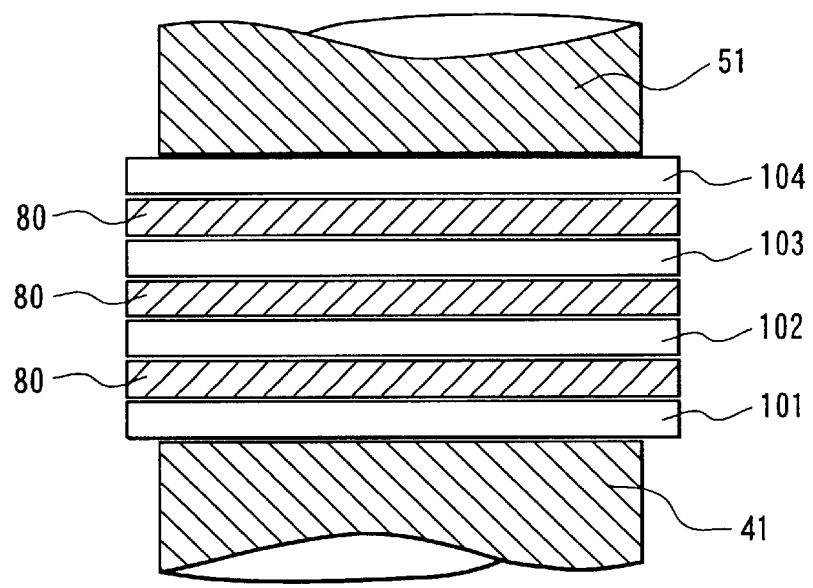
FIG. 8 shows a sectional view of an other pellet of the semiconductor surge absorber according to the invention installed in a package.

FIG. 8 shows an element improving tolerance for surge current of the high voltage element shown in FIG. 7. It is different from FIG. 7 that metal plates 80 are provided between four semiconductor pellets 101,102,103 and 104. Though the thickness of each of the metal plates 80 is about 200 μm which are almost same as the thickness of the semiconductor pellet 101~104, it may be tens μm~a few mm. A material of Ag or Cu system of which the thermal conductivity is excellent is desirable as a material of the metal plate 80.

For the surge absorber applied to a power distribution system as an arrester, it is required that the surge absorber stands the surge current over 10000 A in the operation. Though time when the surge current flows is short in about 100 μs, the electric power of this time is very large. An enough thermal capacity makes the surge absorber stand temperature of this time, even if a wide bandgap semiconductor in which the maximum operation temperature exceeds 1000° C. is applied. The metal plate of the embodiment of FIG. 8 is provided in order to expand the thermal capacity. A surge absorber which stands the large surge current can be realized by the embodiment, even if a volume of comparatively expensive semiconductor substrate is not remarkably increased.

Application range of the semiconductor surge absorber according to the invention contains all of the application that conventional sintering resistor varistors and junction type varistors have been applied. Especially, the semiconductor surge absorber according to the invention is effective for the application of electric apparatuses having cooperatively large operating voltage and surge current. The application effect is described using some embodiments of representative applications in the following.

Figure 9:
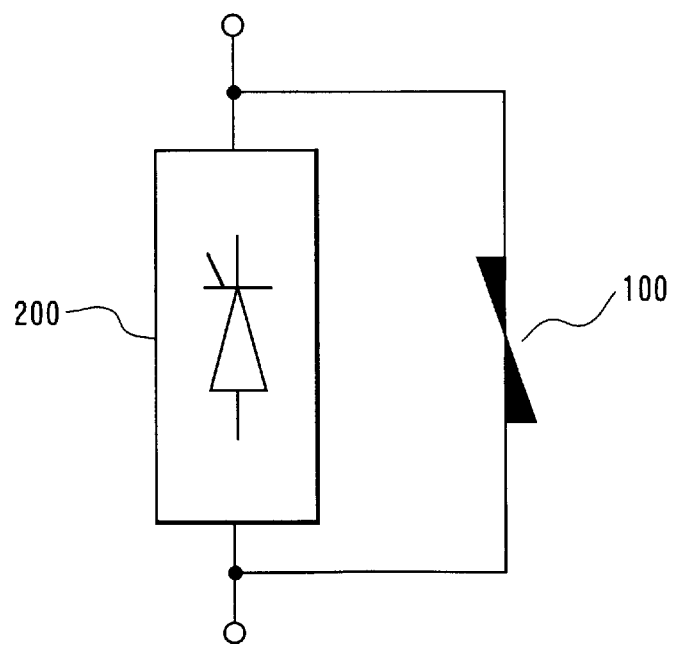
FIG. 9 shows a configuration of a thyristor electric power converter to which the surge absorber according to the invention.

FIG. 9 shows an embodiment to which the surge absorber is applied to protect an electric apparatus from the external lightning surge. Numerals 100, 200 show the surge absorber, a thyristor electric power converter having the thyristors of semiconductor switching devices, respectively. In the thyristor electric power converter 200, the maximum value of source voltage is 30 kV, and the thyristors of 4.5 kV blocking voltage of the necessary number are connected in series. In the surge absorber 100, the ten semiconductor surge absorbers of the above mentioned embodiments with the operation starting voltage of 4.0 kV and with 4.10 kV (FIG. 10) discharge voltage in lightning surge of 10 kA(80 μs) are connected in series. Therefore, in the thyristor electric power converter of this embodiment, if the blocking voltage of the thyristor valve is 45 kV, and if the number of the thyristors is ten, it is possible to sufficiently stand the lightning surge.

Figure 10:
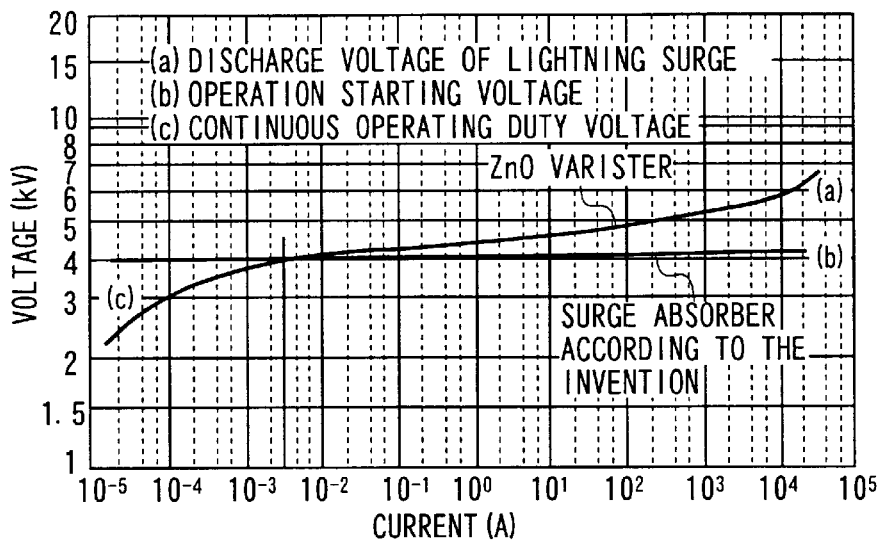
FIG. 10 shows an example of voltage-current characteristics of the surge absorber according to the invention and a conventional ZnO varistor.

The embodiment of FIG. 9 is compared with a case in which a conventional ZnO varistor is used as a surge absorber in the following. FIG. 10 shows examples of current-voltage characteristics of the semiconductor surge absorber according to the invention and the conventional ZnO varistor. The ZnO varistor has the operation starting voltage of 4.0 kV (b), the discharge of voltage of 6.0 kV in 10 kA(80 μs) lightning surge (a). The number of the thyristors connected in series is fifteen, since the blocking voltage of the thyristor valve of the converter must be designed over 60 kV when the converter is protected by the series connection of these ten ZnO varistors. By applying the semiconductor surge absorber according to the invention, the number of the thyristors connected in series in the thyristor valve is reduced to 10. Therefore, the ratio between the maximum blocking voltage and the source voltage of the thyristor electric power converter is reduced from conventional 200% to 150%. As the result, a conversion efficiency is remarkably improved, because power loss of all thyristors in the electric power converter is reduced in about ⅔ by the reduction in the number of thyristors. It is easy to understand that there is the another large effects of a reduction in size of the electric power converter and a reduction of a cost.

While, in FIG. 9, the thyristor electric power converter 200 is shown as the electrical apparatus, the surge absorber according to the invention can be applied to the protection of other electrical apparatuses such as a transformer, a switch and various apparatus in a power distribution system. Insulation voltage for these apparatuses drastically decreases. Therefore, an effect for resource conservation and energy saving is very large. And, an effect for the reduction in the voltage designed value of the apparatuses is large in the apparatus with comparatively high source voltage and comparatively high continuous duty voltage. Especially, the effect is bigger in a high voltage electrical apparatus having the source voltage or the continuous duty voltage not less than 220 V. The application of the semiconductor surge absorber according to the invention can set the blocking voltage of the apparatuses in a range from 100% to 150% of the peak value of the source voltage or the peak value of the continuous duty voltage.

Figure 11:
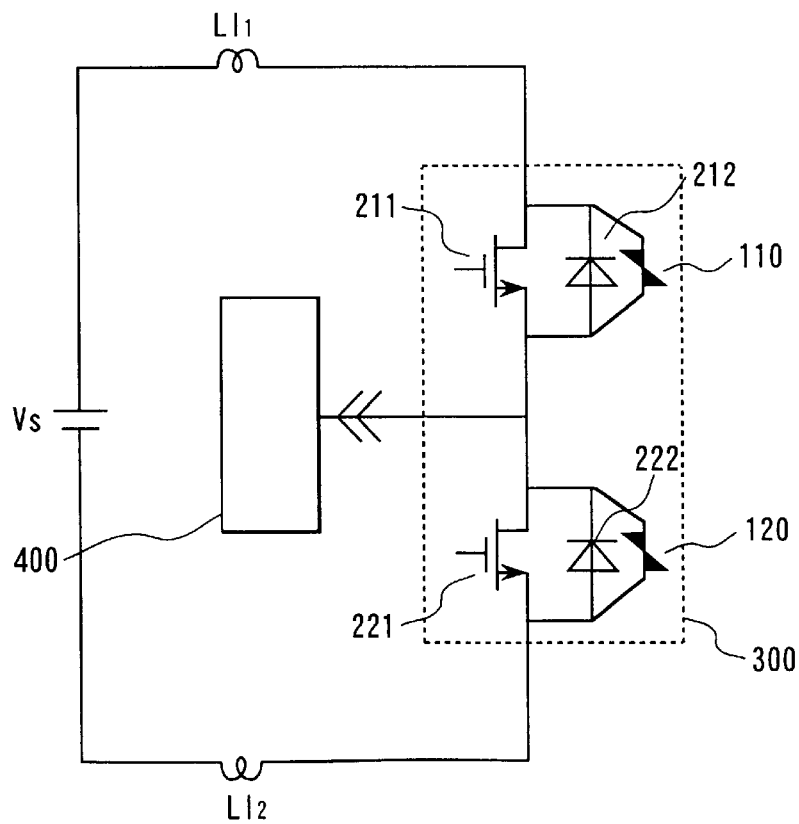
FIG. 11 shows an inverter circuit to which the surge absorber according to the invention is applied.

FIG. 11 shows another embodiment of a DC-AC converter circuit (inverter) using IGBTs (Insulated Gate Bipolar Transistors) as power semiconductor switching devices. The surge absorber according to the invention is applied to the inverter. In FIG. 11, Vs is a DC power source, and Ll1 and Ll2 are wiring inductances of the main circuit, and numeral 400 shows a circuit load such as electric motors. Numeral 300 shows a switching circuit with on-off function of electric current, numerals 211 and 221 show IGBTs, and numerals 212 and 222 show rectifier diodes called free-wheeling diodes connected with the IGBTs in parallel. Numeral 110 and 120 show the semiconductor surge absorbers with the pn junction formed in a SiC single crystal. The semiconductor surge absorber of the first or second embodiment is applied to 110 and 120. The semiconductor surge absorber 110 and 120 are connected to each of the IGBTs 211,221 and the free-wheeling diodes 212, 222 in parallel.

Figure 12:
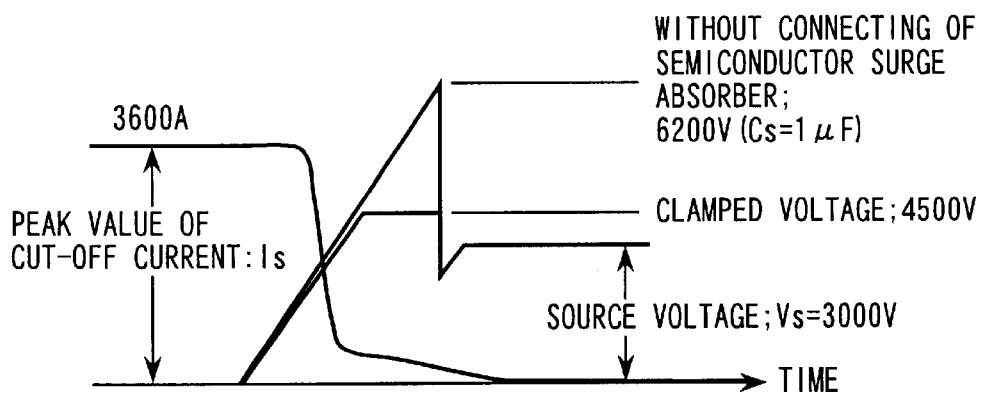
FIG. 12 shows voltage and current waveforms of a switching device in the inverter to which the surge absorber according to the invention is applied.

The following numerical example is explained for comprehensibility of an effect of the embodiment. However, it is not limited at all to the numerical value of the example. A case is assumed, in which a current of peak value Is=3600 A is cut off by the switching circuit 300 at Vs=3000 V, Ll1=Ll2=0.4 μH. FIG. 12 shows voltage and current waveforms of the IGBT in current interruption. In a conventional circuit in which a snubber capacitor of 1 μF for voltage clamping is connected to each of the IGBTs 211,221 without connecting of the semiconductor surge absorbers 110,120, a voltage of 6200 V is applied to the IGBTs by a wiring inductance of the circuit after the current interruption in the IGBTs. Therefore, an IGBT with a blocking voltage not less than 6500 V is necessary for a safely repetitive switching operation. In the case of using the surge absorber 110,120 with the operation starting voltage of 4000 V according to the invention like FIG. 11, the blocking voltage of the IGBT is sufficient at 4500 V. Like this, it is possible to suppress the necessary blocking voltage of the switching device used in the inverter circuit to the value of 100~150% of peak value of source voltage by the application of the surge absorber according to the invention. Therefore, there is very large effect for loss reduction and efficiency improvement of the apparatus, and size reduction and cost reduction of the apparatus with simplification of the circuit.

Figure 13:
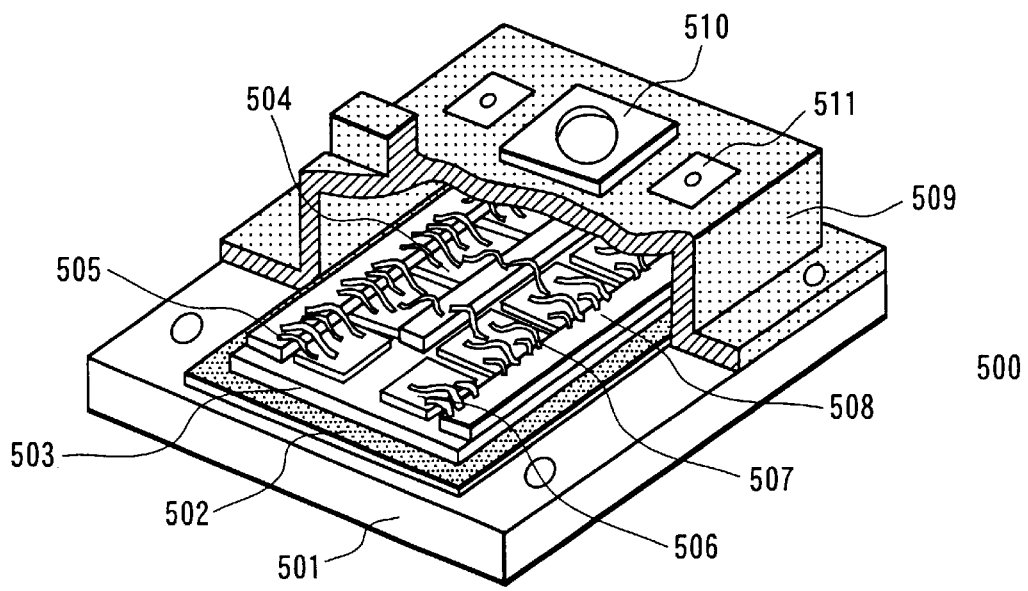
FIG. 13 shows an embodiment of an IGBT power module to which the semiconductor surge absorber according to the invention.

FIG. 13 shows an embodiment of an other application of the invention. This embodiment is a power module which a semiconductor surge absorber according to the invention is applied, and in which an IGBT and an free-wheeling diode are installed.

In a power module 500, a circuit board that an electroconductive metal circuit plate 503 is formed on a surface of an electric insulation ceramic substrate 502 is bonded on a metal heat-sink plate 501. On the circuit board, plural chips of semiconductor devices are mounted being bonded on the metal circuit plate 503. Within the plural semiconductor chips, numeral 504 shows the IGBT of semiconductor switching device, and numeral 505 shows the free-wheeling diode. Numeral 506 shows the semiconductor surge absorber of a junction type varistor having a pn junction formed in a SiC single crystal. The semiconductor surge absorber shown in the first or second embodiment can be applied as the junction type varistor 506. These semiconductor chips are soldered on the electroconductive metal circuit plate 503. Electrodes on surfaces of the chips are electrically connected to an other electroconductive metal circuit plate 508 by metal wires 507 such as aluminum wires. The IGBT 504, the rectifier diode 505 and the surge absorber 506 constitute a parallel connection circuit. The other electroconductive metal circuit plate 508 and the electroconductive metal circuit plate 503 are electrically insulated each other. Numeral 509 shows an outside shield made of an epoxy resin. Numerals 510 and 511 shows an external main electrode terminal and an external control electrode terminal, respectively. FIG. 13 is shown by partly breaking the outside shield 509 in order to show an inner structure. However, the outside shield is formed as it includes all of the semiconductor chips, etc. actually.

When each semiconductor chip is mounted in the package like as the embodiment, a length of an electrical wiring, which connects the IGBT 504 and the free-wheeling diode 505 with the surge absorber, is minimized. Therefore, an effect of the surge absorption for the overvoltage is more remarkably demonstrated, because an induced voltage by the circuit wiring inductance is minimized. The ratio between the maximum blocking voltage and the peak value of source voltage or continuous operating voltage in the IGBT or the diode is not greater than 150% and the ratio is substantially close to 100%.

In the embodiment of FIG. 13, a one-phase IGBT module (numeral 300 in FIG. 11) used in the inverter circuit is shown. However, this invention is not limited to the module of such circuit structure. This invention is also applied to the module with other circuit structure which integratedly mounts several semiconductor chips.

The semiconductor surge absorber according to the invention is applied to the other various electrical apparatus and electrical-electronic apparatus, including various electronic apparatus such as a communication apparatus, a terminal apparatus and a computer, which need to be protected from a surge.

According to the invention, a semiconductor surge absorber with a repetitive operation and a high surge endurance is realized.

Moreover, miniaturization or loss reduction of an apparatus is obtained, when the surge absorber according to the invention is applied to an electrical apparatus such as an electric power converter, an electronic apparatus and a semiconductor power module.

In this disclosure, there is shown and described only the preferred embodiment of the invention, but, as aforementioned, it is to be understood that the invention is capable of use in various other combinations and environments and is capable changes or modifications within the scope of the inventive concept as expressed herein.

What is claimed is:

1. A semiconductor surge absorber comprising:
   a semiconductor substrate having a semiconductor single crystal with a bandgap energy not less than 2.0 eV, said substrate including a first semiconductor layer of a first conductivity type, a second semiconductor layer forming a pn junction with said first layer, and a third semiconductor layer forming another pn junction with said first semiconductor layer;
   an electrode electrically connected to said second semiconductor layer; and
   another electrode electrically connected to said third semiconductor layer.

2. A semiconductor surge absorber according to claim 1, wherein said semiconductor single crystal is selected from the group consisting of SiC, GaN and diamond.

3. A semiconductor surge absorber comprising:
   a semiconductor substrate having a semiconductor single crystal of SiC, said substrate including a first semiconductor layer of a first conductivity type, a second semiconductor layer forming a pn junction with said first layer, and a third layer forming another pn junction with said first semiconductor layer;
   an electrode electrically connected to said second semiconductor layer, and
   another electrode electrically connected to said third semiconductor layer.

4. A semiconductor surge absorber according to claim 1, wherein a punchthrough voltage is smaller than an avalanche voltage in each of said pn junction and said another pn junction.

5. A semiconductor surge absorber comprising:
   a semiconductor substrate having a semiconductor single crystal, said substrate including a first semiconductor layer of a first conductivity type, a second semiconductor layer forming a pn junction with said first layer, and a third layer forming another pn junction with said first semiconductor layer;
   an electrode electrically connected to said second semiconductor layer;
   another electrode electrically connected to said third semiconductor layer, and
   wherein a punchthrough voltage is smaller than an avalanche voltage in each of said pn junction and said another pn junction.

6. A semiconductor surge absorber according to claim 4, wherein a depletion in said second semiconductor layer punches through at said punchthrough voltage of said pn junction and a depletion layer of said third semiconductor layer punches through at said punchthrough voltage of said another pn junction.

7. A semiconductor surge absorber according to claim 6, wherein said second and third semiconductor layers have an impurity concentration larger than said first semiconductor layer.

8. A semiconductor surge absorber according to claim 4, further comprising a fourth semiconductor layer provided in an edge portion on the periphery of said second semiconductor layer, said fourth semiconductor layer having a depth and an impurity concentration larger than said second semiconductor layer, and a fifth semiconductor layer provided in an edge portion on the periphery of said third semiconductor layer, said fifth semiconductor layer having a depth and an impurity concentration larger than said third semiconductor layer.

9. A semiconductor surge absorber according to claim 4, further comprising plural fourth semiconductor layers of a second conductivity type provided in said second semiconductor layer, said fourth semiconductor layers having an impurity concentration larger than said second semiconductor layer, and plural fifth semiconductor layers of said second conductivity type provided in said third semiconductor layer, said fifth semiconductor layers having an impurity concentration larger than said third semiconductor layer.

10. A semiconductor surge absorber according to claim 9, wherein a depth of said fourth semiconductor layers and said fifth semiconductor layers is smaller than those of said second semiconductor layer and said third semiconductor layer, respectively.

11. A semiconductor surge absorber according to claim 8, further comprising plural sixth semiconductor layers of a second conductivity type provided in said second semiconductor layer, said sixth semiconductor layers having an impurity concentration larger than said second semiconductor layer, and plural seventh semiconductor layers of said second conductivity type provided in said third semiconductor layer, said seventh semiconductor layers having an impurity concentration larger than said third semiconductor layer, wherein said fourth semiconductor layer contacts to said sixth semiconductor layer and said fifth semiconductor layer contacts to said seventh semiconductor layer.

12. A semiconductor surge absorber comprising:
at least one semiconductor pellet including a semiconductor substrate having a semiconductor single crystal with a bandgap energy not less than 2.0 eV, said substrate including a first semiconductor layer of a first conductivity type, a second semiconductor layer forming a pn junction with said first layer, a third semiconductor layer forming another pn junction with said first semiconductor layer, an electrode contacting to said second semiconductor layer, another electrode contacting said third semiconductor layer, and a punchthrough voltage smaller than an avalanche voltage in each of said pn junction and said another pn junction;

plural metal electrodes electrically connected to said semiconductor pellet which is put between said metal electrodes, and
an insulator covering over said semiconductor pellet and said metal electrodes.

13. A semiconductor surge absorber according to claim 12, further comprising a plurality of said at least one semiconductor pellet stacked in series.

14. A semiconductor surge absorber according to claim 13, further comprising metal plates being put between said plurality of at least one semiconductor pellet.

15. An electrical-electronic apparatus comprising:
a semiconductor surge absorber that has a semiconductor single crystal with a bandgap energy not less than 2.0 eV.

16. An electrical-electronic apparatus according to claim 15, wherein said semiconductor single crystal is selected from the group consisting of SiC, GaN and diamond.

17. An electrical-electronic apparatus comprising:
a semiconductor surge absorber that has a semiconductor single crystal of siC.

18. An electrical-electronic apparatus according to claim 15, wherein the apparatus has a source voltage or a continuous duty voltage over 220V, and a blocking voltage in a range from 100% to 150% of a peak value of said source voltage or said continuous duty voltage.

19. An electrical-electronic apparatus according to claim 15, including a semiconductor switching device, and said semiconductor surge absorber is connected to said semiconductor switching device in parallel.

20. An electrical-electronic apparatus according to claim 15, wherein said semiconductor surge absorber is the semiconductor surge absorber defined in claim 4.

21. A power module comprising:
a metal plate;
a circuit board bonded on said metal plate; and
a semiconductor surge absorber, a semiconductor switching device and a diode mounted on said circuit board and electrically connected to each other in parallel,
said semiconductor surge absorber including a semiconductor substrate having a semiconductor single crystal with a bandgap energy not less than 2.0 eV, said substrate including a first semiconductor layer of a first conductivity type, a second semiconductor layer forming a pn junction with said first layer, a third semiconductor layer forming another pn junction with said first semiconductor layer, an electrode electrically connected to said second semiconductor layer, another electrode electrically connected to said third semiconductor layer, and a punchthrough voltage smaller than an avalanche voltage in each of said pn junction and said another pn junction.

* * * * *